(12) United States Patent
Koerner

(10) Patent No.: US 7,960,832 B2
(45) Date of Patent: Jun. 14, 2011

(54) INTEGRATED CIRCUIT ARRANGEMENT WITH LAYER STACK

(75) Inventor: Heinrich Koerner, Buckmuehl (DE)

(73) Assignee: Infineon Technologies AG, Munich (DE)

( * ) Notice: Subject to any disclaimer, the term of this patent is extended or adjusted under 35 U.S.C. 154(b) by 377 days.

(21) Appl. No.: 11/438,080

(22) Filed: May 19, 2006

(65) Prior Publication Data

US 2006/0267205 A1 Nov. 30, 2006

(30) Foreign Application Priority Data

May 19, 2005 (DE) .................. 10 2005 023 122

(51) Int. Cl.
*H01L 23/48* (2006.01)
(52) U.S. Cl. ........ 257/751; 257/734; 257/750; 257/753; 257/758; 257/E23.001; 257/E23.142; 257/E23.157; 257/E23.163; 257/768
(58) Field of Classification Search .................. 257/751, 257/753, 758, 764, E21.204, E23.145, 734, 257/750, 768, E23.001, E23.142, E23.157, 257/E23.163
See application file for complete search history.

(56) References Cited

U.S. PATENT DOCUMENTS

| | | | |
|---|---|---|---|
| 5,003,428 A * | 3/1991 | Shepherd | 361/322 |
| 5,942,799 A | 8/1999 | Danek et al. | |
| 6,500,761 B1 | 12/2002 | Wajda et al. | |
| 6,508,919 B1 | 1/2003 | Licata et al. | |
| 6,586,794 B2 | 7/2003 | Nakamura et al. | |
| 6,624,516 B2 | 9/2003 | Fujisawa et al. | |
| 6,724,087 B1 | 4/2004 | Buynoski et al. | |
| 2002/0048937 A1 | 4/2002 | Selsley | |
| 2003/0197205 A1 * | 10/2003 | Marsh et al. | 257/200 |
| 2004/0051117 A1 | 3/2004 | Chyan et al. | |
| 2004/0155348 A1 | 8/2004 | Lee | |
| 2006/0027925 A1 * | 2/2006 | Huang et al. | 257/751 |
| 2007/0252187 A1 * | 11/2007 | List et al. | 257/310 |
| 2008/0157072 A1 * | 7/2008 | Zaidi | 257/42 |
| 2010/0245306 A1 * | 9/2010 | Koyama et al. | 345/205 |

FOREIGN PATENT DOCUMENTS

| | | |
|---|---|---|
| JP | 2001-044073 A | 2/2001 |
| JP | 2001-291844 A | 10/2001 |
| JP | 2002-34859 | 11/2002 |
| JP | 2003-203878 A | 7/2003 |
| JP | 2003-524888 A | 8/2003 |
| JP | 2004-031866 A | 1/2004 |
| JP | 2004-518291 A | 6/2004 |
| WO | WO 01/29893 A1 | 4/2001 |
| WO | WO 02/059944 A2 | 8/2002 |
| WO | WO 2004/042815 A1 | 5/2004 |

OTHER PUBLICATIONS

Japanese Office Action, with English translation, dated Apr. 27, 2010 (8 pages).
Japanese Office Action, with English translation, dated Aug. 17, 2010 (6p).

* cited by examiner

*Primary Examiner* — David Vu
*Assistant Examiner* — Suberr Chi
(74) *Attorney, Agent, or Firm* — Brinks Hofer Gilson & Lione

(57) ABSTRACT

An integrated circuit arrangement includes an electrically conductive conduction structure made from copper or a copper alloy. At a side wall of the conduction structure, there is a layer stack which includes at least three layers. Despite very thin layers in the layer stack, it is possible to achieve a high barrier action against copper diffusion combined with a high electrical conductivity, as is required for electrolytic deposition of copper using external current.

36 Claims, 2 Drawing Sheets

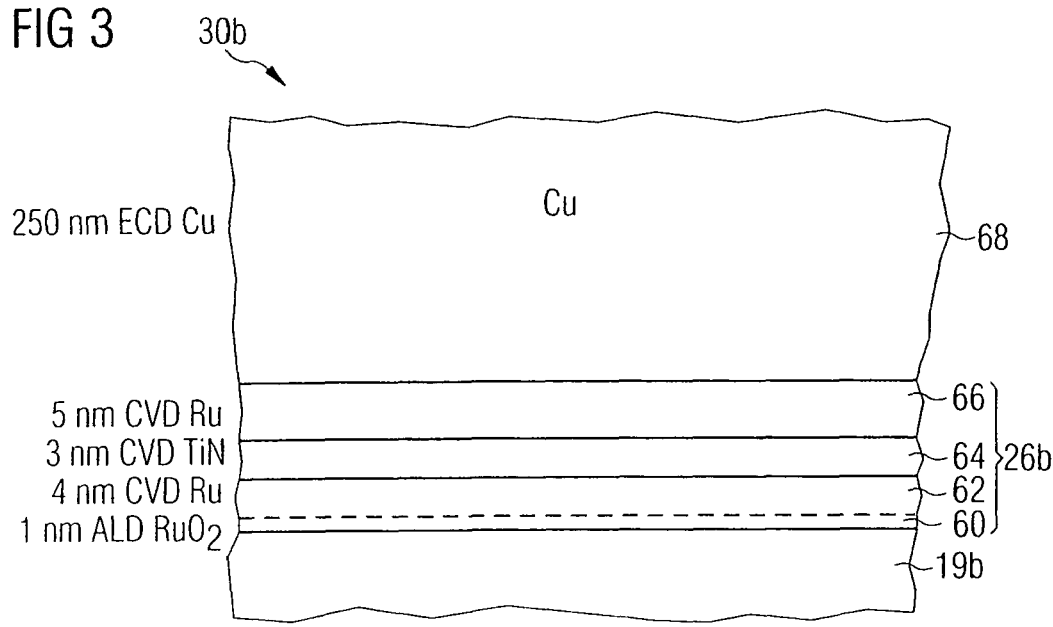
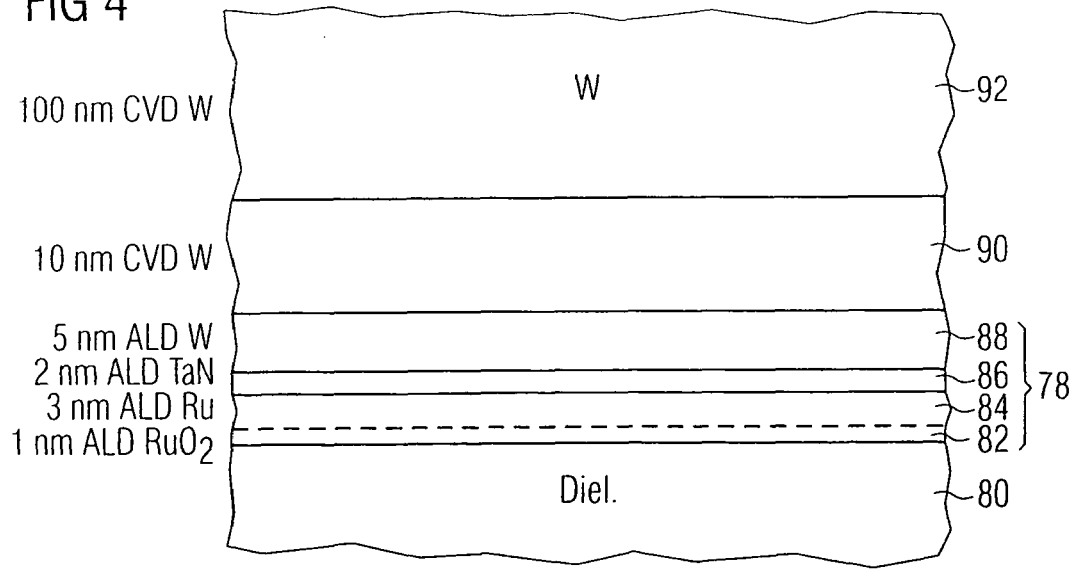

INTEGRATED CIRCUIT ARRANGEMENT WITH LAYER STACK

PRIORITY CLAIM

The present application claims the benefit of priority of German Patent Application No. DE 10 2005 023 122.5, filed May 19, 2005 which is incorporated by reference herein.

BACKGROUND

1. Technical Field

The invention relates to an integrated circuit arrangement, and more particularly, to an integrated circuit arrangement having an electrically conductive conduction structure and a layer stack arranged between the conduction structure and a dielectric at a side wall of the conduction structure.

2. Background Information

The conduction structure includes, for example, an interconnect for lateral current transport or a via for vertical current transport. In this context, the term lateral means parallel to a main surface of a substrate of the circuit arrangement, a multiplicity of integrated semiconductor components being arranged in the main surface. The term vertical means in the normal direction or opposite to the normal direction to the main surface. The conduction structure consists, for example, of copper or a copper alloy. What is known as the single Damascene process or what is known as the dual Damascene process is used in conjunction with copper conduction structures. The conduction structures are embedded in a dielectric, for example in silicon dioxide or a dielectric with a low relative dielectric constant of, for example, less than 3.9 or less than 3.

Layer stacks are used to prevent diffusion of the copper into the dielectric and then into a single-crystal semiconductor substrate, and these layer stacks are also intended to ensure good mechanical bonding between the dielectric and the conduction structure. In a Damascene process, the copper conduction structure is produced using an electrolytic process, for example with a layer thickness of greater than 100 nm. The electrolytic process is carried out using external current, the layer stack being used for current conduction, for example because a fixed potential, which is the opposite potential to a counterelectrode connected as anode, is applied to the edge of the wafer.

Processes for producing ultrathin multilayer stacks and multilayer stacks which overall serve both as reliable bonding layers, as diffusion barriers and also as layers for homogeneous and spontaneous seeding of subsequent chemical vapor deposition (CVD) or electrochemical deposition (ECD) deposition of metal, should which satisfy the thickness requirements of the International Technology Roadmap for Semiconductors (ITRS) 2003, Update 2004, for future technologies. Even with very large wafer diameters (for example 300 mm or above), the multilayer stacks allow homogeneous deposits which form a void-free filling in single or dual Damascene structures with a high aspect ratio, e.g. of greater than one. In particular, deposition of Cu or W by electrolytic, electroless or metalorganic CVD (MOCVD) processes becomes possible. Any surface oxide which may form—unlike in the case of Cu seed layers—will not cause problems and will not lead to fillings which contain voids.

Ultrathin layer combinations of type A/B/A, A/B/A/B/A, A/B/A/B/A/B/A, or A/B/A', A/B/A'/B/A or A', etc., have the properties mentioned, wherein: conduction layer materials A represent, for example, ruthenium (Ru), tungsten (W), rhodium (Rh), rhenium (Re), molybdenum (Mo) or alloys thereof or similar materials; and conduction layer materials A' represent, for example, ruthenium (Ru), tungsten (W), rhodium (Rh), rhenium (Re), molybdenum (Mo), copper (Cu), silver (Ag), gold (Au), palladium (Pd), platinum (Pt) or alloys thereof or similar materials. Examples of suitable A' materials also include nickel (Ni), chromium (Cr) or cobalt (Co), in particular if the material B arranged below is in elemental form, i.e. contains only one type of atom. Interlayer materials B represent, for example, Ta, TaN, a double layer TaN/Ta, TaC, TaCN, TaSiN, WN, WC, WCN, WSiN, TiN, TiC, TiCN, TiSiN, Al, Cr, Ni, Co, Pd, Pt, C or alloys thereof or similar materials.

Pure Ru layers with a thickness of 20, 30 or 40 nm, on account of their columnar structure, are not adequate Cu diffusion barriers, and therefore require additional barrier layers, by way of example the A/B/A/B/A layer combination with $A \leq 5$ nm Ru and $B \leq 2$ nm TaN does constitute a sufficient Cu diffusion barrier.

The materials of group A are typically low-resistance refractory metals, i.e. metals with a melting temperature of greater than 1600° C. or even greater than 2000° C. The group A' is a wider group than group A because of the addition of low-resistance semi-precious metals, e.g. Cu, or low-resistance precious metals. The term low-resistance means that the resistivity is $\rho \leq 50$ μΩ cm or $\rho \leq 20$ μΩ cm, measured for example on a material in bulk form, for example a layer with a thickness of 200 nm or greater. The materials of group A or A' often cannot be alloyed or mixed with Cu or other interconnect materials. The minimum thickness required for the A materials or A' materials is determined by the sheet resistance which is still permissible during the subsequent electrolytic deposition of Cu and by the number of A layers or A' layers. To produce effective diffusion barriers, it has proven particularly advantageous for the deposition process used to deposit the A component or A' component to be interrupted one or more times and for extremely thin ($\leq 2$ nm) layers or processes of the B components to be introduced at least once.

The materials of group B are typically conductive layers with a Cu diffusion barrier action. Because of their own conductivity, they also contribute to the conductivity of the layer stack and therefore to its function as a seeding layer for subsequent deposition processes which require a certain minimum conductivity. However, the contribution of the B components to the barrier action is even more important. Not only do they have a diffusion-inhibiting action themselves, but also, they modify the growth of the subsequent A component or A' component. Whereas the latter preferentially grow in columnar form in thicker single layers, the intercollation of thin and therefore often amorphous B components brings about initially likewise amorphous incipient growth of the A components or A' components. Unlike the A components or A' components in columnar form, the corresponding amorphous or X-ray amorphous A species or A' species likewise make a contribution to the barrier action.

BRIEF SUMMARY

A process is disclosed for the electrolytic deposition of a copper conduction structure in an integrated circuit arrangement includes producing a layer stack. The layer stack includes at least one conduction structure, at least one conduction layer, and at least one interlayer. The conduction structure is electrolytically deposited using a conduction layer of the conduction layers produced last in the layer stack. The at least one conduction structure comprises at least 50 atomic percent copper.

An integrated circuit arrangement is disclosed, including an electrically conductive conduction structure, and a layer stack arranged between the conduction structure and a dielectric positioned at a side wall of the conduction structure. The layer stack includes an electrically conductive first conduction layer with a layer thickness in a range from 5 Å to 60 Å, the first conduction layer consisting of a first material, and an electrically conductive first interlayer with a layer thickness in a range from 2 Å to 30 Å. The first interlayer includes a different material from the first conduction layer, and the first interlayer has a higher electrical resistivity than the first conduction layer. An electrically conductive second conduction layer is also included, with a layer thickness in a range from 5 Å to 60 Å, and the second conduction layer includes a different material from the first interlayer. The second conduction layer has a lower electrical resistivity than the first interlayer.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like referenced numerals designate corresponding parts throughout the different views.

FIG. 3 illustrates a layer stack with one interlayer.

FIG. 4 illustrates a layer stack for a tungsten contact.

DETAILED DESCRIPTION

Figure 1:
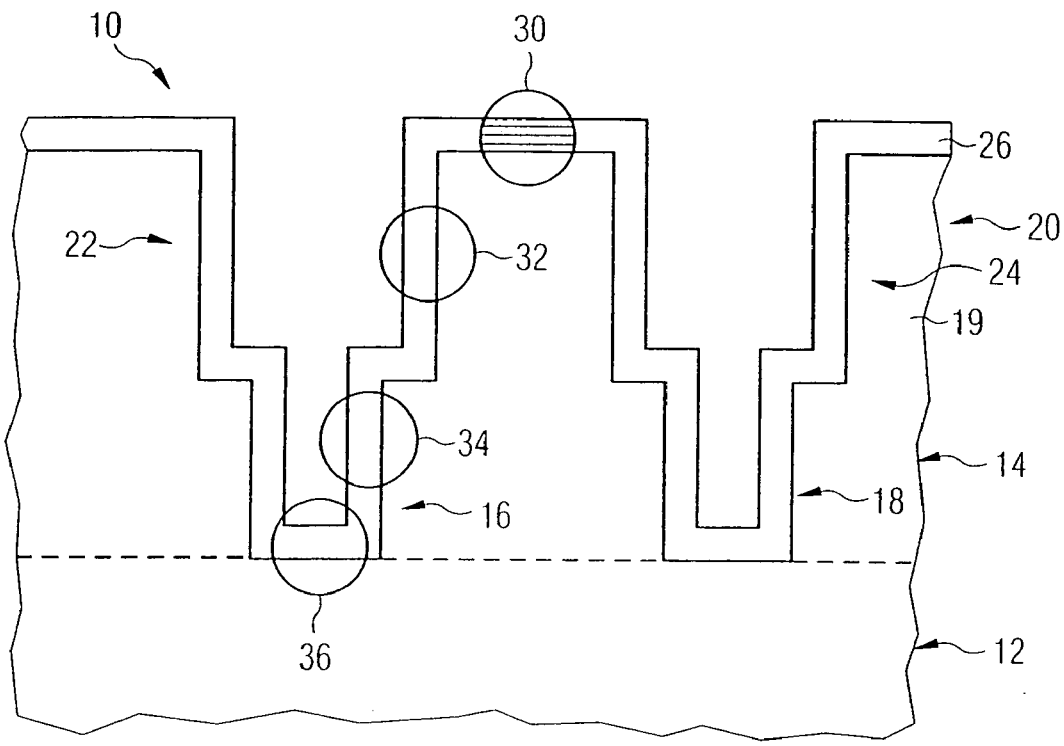
FIG. 1 illustrates a cross section through the metallization of an integrated circuit arrangement along the direction normal to the surface of a semiconductor substrate.

FIG. 1 shows a cross section through a metallization of an integrated circuit arrangement 10 along the direction normal to the surface of a semiconductor substrate (not shown), e.g. a single-crystal silicon substrate. The circuit arrangement 10 includes a lower metallization layer 12. The lower metallization layer 12 is adjoined at the top by a via layer 14, which includes copper vias 16 and 18. The via layer 14 is located in an insulation layer 19, in which there is also arranged an interconnect layer 20 which includes interconnects 22 and 24. The via layer 12 and the interconnect layer 20 may be produced with the aid of a dual Damascene process, a layer stack 26, the structure of which is explained in more detail below, deposited conformally and over the entire surface after production of the recesses for the vias 16, 18 and for the interconnects 22, 24.

Because of the conformal deposition, the following excerpts from the layer stack 26 are substantially identical: an excerpt 30 at the surface of the insulation layer between two interconnects 22, 24, with the part of the layer stack 26 which includes the excerpt 30 being removed again during a subsequent planarization step; an excerpt 32 at the side wall of the interconnect 22, in particular at half the height of the side wall; an excerpt 34 at the side wall of the via 16, in particular at half the height of the side wall; and an excerpt 36 at the bottom of the via 16. At this excerpt 36, the layer stack 26 is arranged not on the dielectric 19, but rather on the metal of the lower metallization layer.

Instead of the lower metallization layer, a polycrystalline conduction structure, for example made from silicon, may be also used. Layer stacks which in terms of their structure correspond to the layer stack 26 may also be arranged in higher metallization layers, in particular in all the higher copper metallization layers. Alternatively, layer stacks of this type are produced in only one or two metallization layers, whereas other barrier layers or other barrier layer stacks are used in other copper metallization layers of the circuit arrangement.

Figure 2:
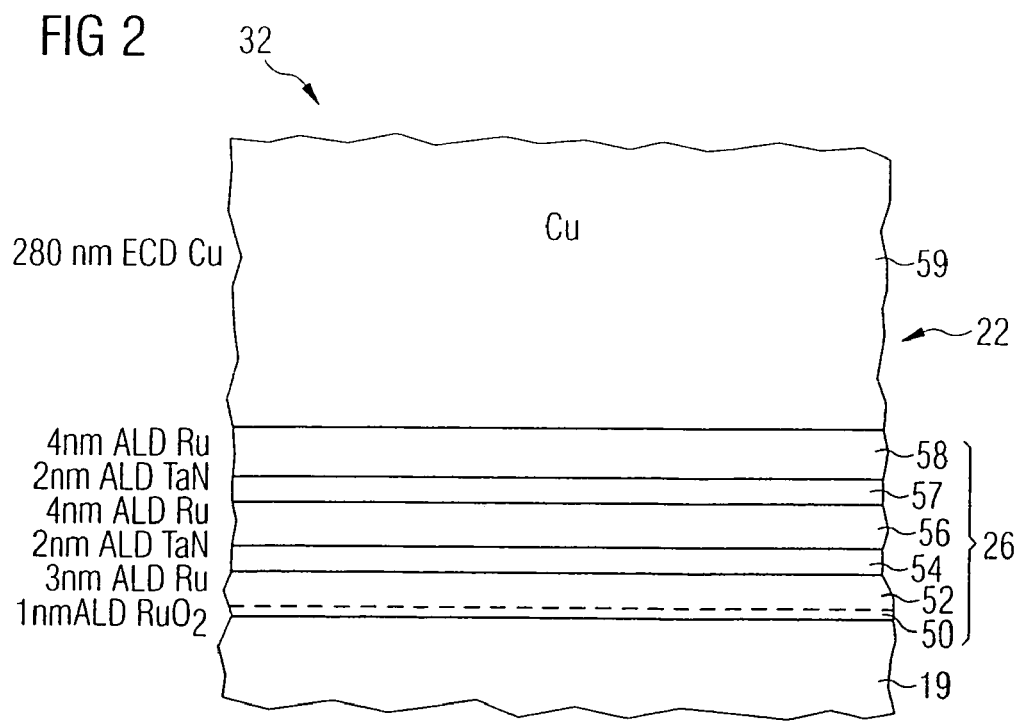
FIG. 2 a layer stack with two interlayers.

FIG. 2 shows the excerpt 32 from the layer stack 26 with two intermediate layers 54 and 57. Previous process steps for the production of microelectronic components on corresponding substrates are known and are therefore not explained in further detail at this point. The substrate is, for example, a single-crystal Si wafer or a silicon on insulation (SOI) wafer. The wafer has a diameter of, for example, greater than or equal to 200 millimeters or greater than or equal to 300 millimeters.

A first insulation layer is deposited and through-contacts are produced, for example by filling with W by chemical vapor deposition (CVD) and chemical mechanical polishing (CMP).

This is followed, for example, by the deposition of a dielectric barrier, for example of 30 nm plasma enhanced CVD silicon nitride (PECVD-SiN) or silicon carbonitride (PECVD-SiCN). Then, the electrically insulating layer 19 is produced, for example by deposition of at least 100 nm of dielectric material, such as PECVD silicon dioxide ($SiO_2$), hydrogenated oxidized silicon carbon (SiCOH), or other low k materials, as intermetal dielectric (IMD) and optional hard masks and auxiliary layers by means of known semiconductor fabrication techniques.

Then, trenches and/or vias are produced in layer 19 by known sequences of resist coating, lithographic exposure and production of resist masks, plasma-enhanced etching steps and resist stripping processes by a known semiconductor fabrication techniques. The minimum lateral feature sizes of the trench for the interconnect 22 are in this case, for example, less than 100 nanometers.

Then, the dielectric barrier is opened, for example by plasma-enhanced etching steps by a known semiconductor fabrication techniques. Next the wafer is introduced into a multichamber installation for the deposition of metallic layers, for example into a multichamber installation with a base vacuum pressure of less than 10 mTorr or 1.3 Pa. An optional degassing and cleaning step is carried out by a known semiconductor fabrication techniques, for example by physical or wet-chemical means.

After the wafer has been introduced into an atomic layer deposition (ALD) chamber, for example 1 nm of ALD $RuO_2$ of a bonding layer 50 and 3 nm of Ru of a first conduction layer 52 are deposited at, for example, T=280° C. (degrees Celsius), for example using alternating pulses of $Ru(C_2H_5C_5H_4)_2$ [bis(ethylcyclopentadienyl)ruthenium (II)] and oxygen-containing gas mixtures, between each of which pulses there is a short purging step using inert gas, for example using molecular nitrogen $N_2$. To deposit, for example, a one nanometer thick bonding layer 50 of $RuO_2$, initially an oxygen/argon gas mixture comprising 85 percent oxygen $O_2$, based on the total gas quantity of the oxygen/argon gas mixture, is used as reaction partner. After the deposition of approximately 1 nm of $RuO_2$, deposition is continued using an oxygen/argon gas mixture comprising 42 percent oxygen, based on the total gas quantity of the oxygen/argon gas mixture, to deposit pure Ru for the first conduction layer 52 with an electrical resistivity of $\rho=17$ $\mu\Omega$ cm. The deposition rate is, for example, 0.16 nm/cycle or 1.6 Å per cycle.

The wafer is then transported into a second ALD chamber, for example into a chamber of the same installation, in particular into an ALD chamber adjacent to the ALD chamber used previously. 2 nm of ALD tantalum nitride (TaN) of a first interlayer 54 are deposited directly on the first conduction layer 52, for example using alternating pulses of tantalum tris(diethylamino)-t-butylimide and ammonia $NH_3$, between which there is in each case a short purging step, for example using inert gas ($N_2$/Ar). The temperature in the chamber is, for example, T=260° C. The deposition rate is, for example, 0.4 Å/cycle.

Then, the wafer is, for example, introduced back into the ALD chamber used first, where, for example, 4 nm of ALD Ru of a second conduction layer 56 are deposited under the same process conditions as during the deposition of the first conduction layer 52. The second conduction layer 56 is produced directly on the interlayer 54, so that the interlayer 54 and the second conduction layer 56 adjoin one another.

Then, the wafer is transported back into the second ALD chamber where, for example, 2 nm of ALD TaN of a second interlayer 57 are deposited on the second conduction layer 56 under the same process conditions as for the production of the first interlayer 54.

Then, the wafer is once again introduced into the ALD chamber used first. In the chamber used first, a third conduction layer 58, which for example has a layer thickness of 4 nm and is an ALD ruthenium layer, is produced on the second interlayer 57. During the deposition of the third conduction layer 58, the deposition conditions used are once again the same as during the deposition of the first conduction layer 52.

The result is a layer stack 26 which includes, in the following order: a lower bonding layer 50, which has an electrical resistivity of approximately 20 $\mu\Omega$-cm; a first conduction layer 52 of ruthenium with an electrical resistivity of approximately 10 $\mu\Omega$-cm; a first interlayer 54 with an electrical resistivity of approximately 200 $\mu\Omega$-cm; a second conduction layer 56 of ruthenium with an electrical resistivity of approximately 10 $\mu\Omega$-cm; a second interlayer 57 with an electrical resistivity of approximately 200 $\mu\Omega$-cm; and a third conduction layer 52 of ruthenium with an electrical resistivity of approximately 10 $\mu\Omega$-cm.

Although the conduction layers 52, 56 and 58 serve for current transport during the electrolytic deposition of the copper, that is, having the function of a seed layer, they also perform functions of a copper diffusion barrier, in particular on account of amorphous partial layers at the boundaries with the interlayer 54 or 57 respectively arranged beneath them. Likewise, although the interlayers 54 and 57 serve predominantly as a copper diffusion barrier, a current also flows through the interlayers during the electrolytic deposition of copper, in particular transversely with respect to the interlayer and in the lateral direction of the interlayer.

Then, the substrate or the wafer is removed from the multichamber installation and passed to the process station for the electrolytic deposition of Cu, where a bulk conduction structure layer 59 of copper with a layer thickness of more than 100 nanometers, for example with a layer thickness of 280 nm, is deposited. Known electrolytic processes are utilized, for example at room temperature with final cleaning of the substrate by purging with DI water and isopropanol.

Then, conditioning of the coated substrate is carried out at a temperature greater than 100° C. for, for example, more than 10 minutes, for example at 150° C. for 15 min. Conditioning may take place in forming gas comprising 95 percent molecular nitrogen and 5 percent molecular hydrogen. However, the conditioning temperature is lower than 450° C. or lower than 350° C.

After the conditioning, copper regions, multilayer barrier regions and dielectric parts which project beyond the trench or via are removed by at least one CMP step with subsequent cleaning by means of known semiconductor fabrication techniques. The further procedure and completion takes place in accordance with the prior art, with the abovementioned procedure also being carried out repeatedly to form multilayer metallizations.

Layers 50 to 58 are produced using a CVD process, or some layers may be produced using an ALD process and other layers using a CVD process. The layer stack 26 additionally may also include an upper, third interlayer, which is of the same structure as the first interlayer 54, and an upper, fourth conduction layer, which is of the same structure as the first conduction layer 52. The conduction layers and the interlayers may be designed to be thinner than has been explained with reference to FIG. 2. Further interlayers and conduction layers may be added, with the layer thicknesses of the individual layers being reduced further. The final layer of the layer stack is a conduction layer, which adjoins the conduction structure.

FIG. 3 shows a layer stack 26b with only one interlayer 64. The process steps explained above with reference to FIG. 2, including the optional degassing and cleaning step, are first carried out. Then, the wafer to which the insulation layer 19b has been applied is introduced into a CVD chamber. For example, 1 nm of CVD-$RuO_2$ of a bonding layer 60 and 4 nm of a first conduction layer 62 are deposited from bis(cyclopentadienyl)ruthenium (II) and $O_2$/Ar mixtures at, for example, 315° C. To deposit $RuO_2$ initially, at the start a gas mixture of oxygen $O_2$ and argon with 90 percent oxygen $O_2$ is used at the beginning. After the deposition of approx. 1 nm of $RuO_2$, pure ruthenium with an electrical resistivity of $\rho=13$ $\mu\Omega$ cm is deposited using $O_2/(O_2+Ar)=22$ percent.

The wafer is then transported into a further CVD chamber, for example into a chamber of the same installation adjoining the CVD chamber used first. In the further chamber, by way of example 3 nm of CVD-TiN of an interlayer 64 are deposited from tetrakis(dimethylaminotitanium) at, for example, 350° C. and, for example, 4 Torr total pressure, directly on the first conduction layer 62. An optional subsequent $N_2/H_2$ plasma step (e.g. produced by introduction of an RF voltage of 13.56 MHz and a power of, for example, 5 W/$cm^2$) serves to compact and stabilize the layer.

Then, the wafer is transported back into the CVD chamber used first or into a different CVD chamber. For example, 5 nm thick CVD-Ru second conduction layer 66 is deposited under the same process conditions as the first conduction layer 62. The second conduction layer 66, like the other layers deposited using an ALD or CVD process, has a substantially constant layer thickness with thickness fluctuations of less than 10 percent, based on the mean layer thickness of this layer.

After the second conduction layer 66 has been produced, the wafer or substrate is transported out of the multichamber installation to the process station for electrolytic deposition of Cu, where the process steps which have been explained above with reference to FIG. 2 are carried out, i.e. in particular electrolytic deposition of a, for example, 250 nm thick copper layer 68 for an interconnect and/or for a via filling, the conditioning and the further processing.

The layers 60 to 66 may be produced using an ALD process or some layers are produced using a CVD process and other layers using an ALD process.

FIG. 4 shows a layer stack 78 for lining a W contact 92, which is part of the first metallization layer directly adjacent to a single-crystal semiconductor substrate. FIG. 4 applies to a layer stack 78 at a side wall of the contact 92, the layer stack 78 adjoining a dielectric 80 which consists of an electrically insulating material. However, a layer stack which is identical to the layer stack 78 is also present on the bottom of the W contact, except that the semiconductor substrate, if appropriate provided with a thin silicide layer, is located there instead of the dielectric 80.

The process steps for producing microelectronic components which precede the production of the layer stack 78 are carried out on corresponding substrates, such as for example silicon wafers. By way of example, a multiplicity of transistors of a processor or of a semiconductor memory, for example a RAM (random access memory) with volatile storage, or a nonvolatile semiconductor memory, are produced.

To produce the bottom metallization layer, by way of example 20 nm of silicon nitride SiN and, for example, 600 nm of insulation layer 80 are deposited from borophosphosilicate glass (BPSG) and/or tetraethylorthosilicate (TEOS-SiO$_2$) and thermal flow at temperatures greater than 600° C. by known semiconductor fabrication techniques. This is followed by planarization of the dielectric 80 by chemical mechanical polishing (CMP) or in some other way by means of known semiconductor fabrication techniques.

Then, contact holes and/or what are known as local interconnects, i.e. formed from trenches with a low lateral width of, for example, less than 10 micrometers, are produced by known sequences of resist coating, lithographic exposure and production of resist masks, plasma-enhanced etching steps and resist stripping processes by known semiconductor fabrication techniques. In a subsequent cleaning step, the contact holes or trenches which have been created in this way are cleaned by known semiconductor fabrication techniques, for example by physical or wet chemical methods.

Then, the wafer which carries the dielectric 80 is introduced, for example, into a multichamber installation for the deposition of metallic layers with a base vacuum of better than 1 Torr or 133 Pa. This is followed by an optional degassing step, for example by argon plasma sputtering.

The wafer is transported into an ALD chamber where, for example, 1 nm of ALD RuO$_2$ of a bonding layer 82 and, for example, 3 nm of a first conduction layer 84 of ALD Ru are deposited. The same process conditions as during production of the bonding layer 50 or the first conduction layer 52 are used.

Then, the wafer is transported into a further ALD chamber, where 2 nm of ALD TaN of an interlayer 86 are deposited on the first conduction layer 84, for example under the same process conditions as those used to produce the interlayer 54.

After the wafer has been transferred into an ALD-CVD chamber, 115 nm of W are deposited for contact filling, for example by: purging with 20 sccm of silane (SiH$_4$) flow at 370° C. for 15 seconds at p=10 Torr or 1333 Pa; depositing a second conduction layer 88 of, for example, 5 nm of ALD W with the aid of alternating tungsten hexafluoride WF$_6$ and silane SiH$_4$ pulses with intervening N$_2$ purge pulses, of, for example, five seconds at, for example, 370° C.; depositing an auxiliary layer 90 of, for example, 10 nm of W CVD with the aid of silane SiH$_4$ (with the silane gas flow amounting for example to 10 sccm), argon Ar (for example 130 sccm), molecular hydrogen H$_2$ (for example 120 sccm) and WF$_6$ (for example 30 sccm) at, for example, 370° C. for, for example, 8 seconds at a pressure of, for example, p=10 Torr or 1333 Pa; depositing the main contact filling 92 comprising, for example, 100 nm of W-CVD using Ar (for example 350 sccm), molecular hydrogen H$_2$ (for example 1700 sccm) and WF$_6$ (for example 330 sccm) at, for example, 370° C. for, for example, 30 seconds at a pressure of, for example, p=80 Torr or 10 664 Pa.

Then, the W through-contacts are produced by removing parts of the W, of the multilayer barrier and of the dielectric 80 in at least one CMP step with subsequent cleaning. This is followed by the further processing as described in the above examples or in accordance with the prior art.

An explanation has been given of an integrated circuit arrangement 10 which includes an electrically conductive conduction structure 16, 22 of copper or a copper alloy. At a side wall of the conduction structure 16, 22 there is a layer stack 32 which includes at least three layers. Despite very thin layers in the layer stack 32, it is possible to achieve a high barrier action with respect to copper diffusion combined with a high electrical conductivity, as is required for electrolytic deposition of copper using external current.

In the disclosure above, there are no further layers between the layers explained, apart from any binary interfacial layers which may form between adjacent layers. However, in other examples, further layers are arranged between the layers explained, in particular layers with layer thicknesses of less than 6 nm.

It is therefore intended that the foregoing detailed description be regarded as illustrative rather than limiting, and that it be understood that it is the following claims, including all equivalents, that are intended to define the spirit and scope of this invention.

In addition to the deposition of thin B components, in a refinement the following steps also have a similar effect:

Interrupting the A deposition or A' deposition and conditioning at up to 400° C. in gas mixtures which contain one or more of the components N$_2$, Ar, O$_2$, NH$_3$, hydrocarbons or H$_2$.

Interrupting the A deposition or A' deposition and carrying out plasma flash or a brief sputtering step using gas mixtures which contain one or more of the components N$_2$, Ar, O$_2$, NH$_3$, hydrocarbons or H$_2$.

Therefore, the overall result is that reduced total thicknesses of barrier component B are required to achieve the same barrier action compared to the two-layer or three-layer system of type B/A or B/B'/A (e.g. TaN/Ta/Cu). At the same time, there is no need for thicker layers of the A component or A' component for the seed layer function compared to the comparison case.

A further refinement makes use of the fact that, for example, ruthenium forms an oxide (RuO$_2$) which has a conductivity similar to that of the pure metal, of approximately 20 µΩ cm. It therefore becomes possible to start a, for example, A/B/A/B/A layer sequence first of all with a thin A oxide layer, which then merges continuously or abruptly into a pure A layer. This A oxide has very good bonding to the typical IMD (intermetal dielectric) materials, such as for example SiO$_2$ or SiCOH, and obviates the need for additional bonding layers, as are required with Cu seed layers or Cu growth nucleation layers. On account of the high conductivity of RuO$_2$, an oxide layer formed at the surface does not disrupt subsequent processes, such as for example electrolytic deposition of Cu, and these deposition operations can be carried out more reproducibly, more reliably, more uniformly and without the formation of voids.

Suitable deposition methods for A components or A' components include PVD (physical vapor deposition), in particular processes with a high plasma density and/or a high degree of ionization of the material to be deposited, e.g. IPVD (ionized PVD) or SIP (self-ionized plasma). Other deposition methods include CVD (chemical vapor deposition), ALD (atomic layer deposition), electrodeposition or electroless processes or also SFD (supercritical fluid deposition) using, for example, supercritical $CO_2$. The same methods are fundamentally also suitable for B components. It is preferable for the multilayers to be produced in multichamber installations, such as for example an "Endura" from Applied Materials. These offer the option of producing the layers, with all the required pretreatments and aftertreatments, with or without vacuum interruption, in direct succession using different parameters (such as temperature, pressure, gas flow rates) or different media in one or more deposition chambers, resulting in fast, inexpensive and well controlled production.

Prior to the production of the layer stack:
- a cleaning step, for example for removing surface oxides on existing metal layers,
- the deposition of a separate, thin bonding or nucleation layer,
- a step for sealing pores in porous low-k materials, or the like can optionally be carried out.

The production of the layer stack may optionally be followed by:
- the deposition of a very thin Cu layer, e.g. thinner than 1 nm or thinner than 3 nm,
- a cleaning step for generating defined surfaces,
- an annealing or conditioning step,
- the deposition of a material which functions as an interconnect material, or the like.

The advantages of the multifunctional layer stacks according to the invention can be summarized as follows:
- large effective cross section of the copper conduction structure, associated with high current-carrying capacity; in particular, the layer stack, even with minimum lateral dimensions of the conduction structure of less than 100 nm, takes up only less than 10% of the total cross section,
- excellent properties as diffusion-inhibiting barrier and low-resistance seeding layers at very low layer thicknesses for individual components and layer stacks,
- reliable, spontaneous and uniform seeding during subsequent processes, such as for example Cu-ECD (electrochemical deposition) or -(MO)CVD both laterally over the entire wafer and in structures with extremely demanding aspect ratios, for example greater than 1 or greater than 2) and geometries (e.g. minimum dimensions smaller than 100 nm),
- extremely low roughness of the layer stack and the "interconnect material" which is subsequently deposited,
- allows void-free filling of Damascene structures and therefore the production of interconnects with a high current-carrying capacity,
- can be scaled,
- relatively insensitive to the formation of surface oxides,
- minimizing or targeted setting of, for example, certain layer stress properties over the layer combination possible, and therefore minimal risk of delamination, crack formation, etc.,
- materials and methods can be selected and combined from a wide range,
- can be combined with pretreatment and aftertreatment steps,
- inexpensive,
- suitable for Damascene and also for subtractive architectures.

The invention also relates to a process for producing the circuit arrangement according to the invention or one of its refinements. In a refinement of the process, electrolytic copper deposition with external current and without the use of a copper nucleation layer is applied direct to the layer stack.

Therefore, the invention provides processes for producing ultrathin low-resistance layer stacks and also layer stacks which serve both as bonding layer, barrier layer and seeding layer in multilayer metallizations of integrated circuits. The layer stacks consist of at least two different layer materials, of which at least one material (B) is amorphous or partially amorphous and which interrupts the other material (A) or the other materials (A, A') at least once.

The invention claimed is:

1. An integrated circuit arrangement comprising:
an electrically conductive conduction structure; and
a layer stack arranged between the conduction structure and a dielectric positioned at a side wall of the conduction structure, wherein the layer stack comprises:
an electrically conductive first conduction layer consisting of a first material;
an electrically conductive first interlayer comprising a different material from the first conduction layer, and the first interlayer having a higher electrical resistivity than the first conduction layer, wherein the first conduction layer is arranged between the first interlayer and the dielectric;
an electrically conductive second conduction layer comprising a different material from the first interlayer, and the second conduction layer having a lower electrical resistivity than the first interlayer;
an electrically conductive second interlayer; and
an electrically conductive third conduction layer comprising a first end in contact with the second interlayer and a second end coupled with the conduction structure, the electrically conductive third conduction layer consisting of the first material.

2. The circuit arrangement as claimed in claim 1, wherein the first conduction layer and the second conduction layer each comprise a layer thickness in a range from 5 Å to 60 Å, and wherein the first interlayer comprises a layer thickness in a range from 2 Å to 30 Å.

3. The circuit arrangement as claimed in claim 1, wherein the second interlayer comprises a different material from the second conduction layer, and the second interlayer has a higher electrical resistivity than the second conduction layer, and wherein the third conduction layer comprises a different material from the second interlayer, and the third conduction layer has a lower electrical resistivity than the second interlayer.

4. The circuit arrangement as claimed in claim 1, wherein the first conduction layer and the second conduction layer each comprise a layer thickness in a range from 5 Å to 50 Å, and wherein the first interlayer and the second interlayer each comprise a layer thickness in a range from 2 Å to 25 Å.

5. The circuit arrangement as claimed in claim 1, wherein the conduction structure contains at least 50 atomic percent copper, and wherein the material of at least one of the first interlayer and the second interlayer comprises a copper diffusion barrier.

6. The circuit arrangement as claimed in claim 5, wherein the electrical resistivity of the material of at least one of the first conduction layer, the second conduction layer or the third conduction layer is less than 50 $\mu\Omega$-cm.

7. The circuit arrangement as claimed in claim 6, wherein the first conduction layer contains at least one of the following materials: ruthenium, tungsten, rhodium, rhenium, or molybdenum.

8. The circuit arrangement as claimed in claim 6, wherein the third conduction layer of the layer stack next to the conduction structure comprises a different material from the conduction structure.

9. The circuit arrangement as claimed in claim 1, wherein the first conduction layer comprises ruthenium.

10. The circuit arrangement as claimed in claim 1, wherein at least one of the first interlayer and the second interlayer contains at least one of the following materials: tantalum, tantalum nitride, tantalum carbide, tantalum carbonitride, tantalum siliconitride, titanium nitride, titanium carbide, titanium carbonitride, titanium siliconitride, tungsten nitride, tungsten carbide, tungsten carbonitride, tungsten siliconitride, aluminum, chromium, nickel, cobalt, or carbon; or wherein at least one of the first interlayer, the second interlayer, or the third interlayer comprises a barrier layer adapted to prevent a diffusion of copper.

11. The circuit arrangement as claimed in claim 10, wherein at least one of the second conduction layer and the third conduction layer contains at least one of the following materials: ruthenium, tungsten, rhodium, rhenium, molybdenum, copper, silver, gold, palladium, or platinum.

12. The circuit arrangement as claimed in claim 1, wherein the first conduction layer contains ruthenium, the first interlayer contains tantalum nitride, and wherein the second conduction layer contains ruthenium.

13. The circuit arrangement as claimed in claim 12, wherein the second interlayer of the layer stack comprises a layer containing tantalum nitride arranged between the conduction structure and the second conduction layer.

14. An integrated circuit arrangement comprising:
an electrically conductive conduction structure; and
a layer stack arranged between the conduction structure and a dielectric positioned at a side wall of the conduction structure, wherein the layer stack comprises multiple layers comprising:
an upper layer, wherein the upper layer is a layer of the layer stack that is most proximate to and coupled with the conduction structure;
a lower layer, wherein the lower layer is a layer of the layer stack that is most proximate to the dielectric; and
at least one electrically conductive interlayer arranged between the upper and lower layers;
wherein the upper layer and the lower layer of the layer stack are each electrically conductive conduction layers of substantially the same material, and
wherein the upper layer and the lower layer comprise a layer thickness in a range of 5 Å to 60 Å.

15. The integrated circuit arrangement of claim 14, wherein the layer stack further comprises an alternatingly stacked arrangement of electrically conductive conduction layers and electrically conductive interlayers.

16. The integrated circuit arrangement of claim 14, wherein the at least one electrically conductive interlayer comprises a different material from the upper layer and from the lower layer.

17. The integrated circuit arrangement of claim 14, wherein the at least one electrically conductive interlayer comprises a higher electrical resistivity than the upper layer and the lower layer.

18. The integrated circuit arrangement of claim 14, wherein the upper and lower layers each comprise at least one of the following materials:
ruthenium, tungsten, rhodium, rhenium, or molybdenum.

19. An integrated circuit arrangement comprising:
an electrically conductive conduction structure; and
a layer stack arranged between the conduction structure and a dielectric positioned at a side wall of the conduction structure, wherein the layer stack comprises multiple layers comprising:
an upper layer, wherein the upper layer is a layer of the layer stack that is most proximate to and coupled with the conduction structure;
a lower layer, wherein the lower layer is a layer of the layer stack that is most proximate to the dielectric; and
at least one electrically conductive interlayer arranged between the upper and lower layers;
wherein the upper layer and the lower layer of the layer stack are each electrically conductive conduction layers of substantially the same material, and
wherein the electrically conductive interlayer comprises a layer thickness in a range of 2 Å to 30 Å.

20. An integrated circuit arrangement comprising:
an electrically conductive conduction structure; and
a layer stack arranged between the conduction structure and a dielectric positioned at a side wall of the conduction structure, wherein the layer stack comprises:
an electrically conductive first conduction layer with a layer thickness in a range from 5 Å to 50 Å, the first conduction layer comprising a first material and a first end in contact with the dielectric or in contact with an electrically conductive oxide layer that is in contact with the dielectric and comprises a layer thickness in the range from 5 Å to 50 Å;
an electrically conductive interlayer with a layer thickness in a range from 2 Å to 25 Å, the interlayer comprising a different material from the first conduction layer and a higher electrical resistivity than the first conduction layer, wherein the first conduction layer is arranged between the interlayer and the dielectric, and the interlayer further comprises a first end in contact with the first conduction layer; and
an electrically conductive second conduction layer with a layer thickness in a range from 5 Å to 50 Å, the second conduction layer comprising a different material from the interlayer and a lower electrical resistivity than the interlayer and further comprising a first end in contact with the interlayer and a second end in contact with the conduction structure.

21. The integrated circuit arrangement of claim 20, wherein the second conduction layer is amorphous near the interlayer and is columnar near the conduction structure.

22. An integrated circuit arrangement, comprising:
an electrically conductive conduction structure; and
a layer stack arranged between the conduction structure and a dielectric at a side wall of the conduction structure, the layer stack comprising the following in order of increasing distance from the dielectric:
an electrically conductive first conduction layer comprising a layer thickness in a range of 5 Å to 60 Å, the first conduction layer consisting of a first material;
an electrically conductive first interlayer comprising a layer thickness in a range of 2 Å to 30 Å, the first interlayer consisting of a different material than the first conduction layer, and the first interlayer comprising a higher electrical resistivity than the first conduction layer;

an electrically conductive second conduction layer comprising a layer thickness in a range of 5 Å to 60 Å, the second conduction layer consisting of a different material than the first interlayer, and the second conduction layer comprising a lower electrical resistivity than the first interlayer, wherein the first conduction layer consists of one of the following materials: ruthenium, rhodium, rhenium, and molybdenum; and wherein the first interlayer consists of one of the following materials: tantalum, tantalum nitride, tantalum carbide, tantalum carbonitride, tantalum siliconitride, titanium nitride, titanium carbide, titanium carbonitride, titanium siliconitride, tungsten nitride, tungsten carbide, tungsten carbonitride, and tungsten siliconitride.

23. The integrated circuit arrangement as claimed in claim 22, further comprising an electrically conductive oxide layer arranged between the layer stack and the dielectric.

24. The circuit arrangement as claimed in claim 23, wherein the oxide layer comprises a layer thickness of approximately 1 nm.

25. The circuit arrangement as claimed in claim 23, wherein the oxide layer adjoins the dielectric and the first conduction layer adjoins the oxide layer.

26. The integrated circuit arrangement as claimed in claim 23, wherein the electrically conductive structure, layer stack, and oxide layer form part of a dual Damascene integrated circuit arrangement.

27. The integrated circuit arrangement as claimed in claim 26, wherein oxide layer comprises ruthenium oxide.

28. An integrated circuit arrangement comprising:
an electrically conductive conduction structure;
a layer stack arranged between the conduction structure and a dielectric positioned at a side wall of the conduction structure, wherein the layer stack comprises:
an electrically conductive first conduction layer consisting of a first material;
an electrically conductive first interlayer comprising a different material from the first conduction layer, and the first interlayer having a higher electrical resistivity than the first conduction layer, wherein the first conduction layer is arranged between the first interlayer and the dielectric;
an electrically conductive second conduction layer comprising a different material from the first interlayer, and the second conduction layer having a lower electrical resistivity than the first interlayer;
an electrically conductive second interlayer; and
an electrically conductive third conduction layer comprising a first end in contact with the second interlayer and a second end coupled with the conduction structure, the electrically conductive third conduction layer consisting of the first material; and
an electrically conductive oxide layer arranged between the first conduction layer and the dielectric.

29. The circuit arrangement as claimed in claim 28, wherein the oxide layer comprises a layer thickness of approximately 1 nm.

30. The circuit arrangement as claimed in claim 28, wherein the oxide layer adjoins the dielectric and the first conduction layer adjoins the oxide layer.

31. The integrated circuit arrangement as claimed in claim 28, wherein the electrically conductive structure, layer stack, and oxide layer form part of a dual Damascene integrated circuit arrangement.

32. The integrated circuit arrangement as claimed in claim 31, wherein oxide layer comprises ruthenium oxide.

33. An integrated circuit arrangement comprising:
an electrically conductive conduction structure; and
a layer stack arranged between the conduction structure and a dielectric positioned at a side wall of the conduction structure, wherein the layer stack comprises multiple layers comprising:
an upper layer, wherein the upper layer is a layer of the layer stack that is most proximate to and coupled with the conduction structure;
a lower layer, wherein the lower layer is a layer of the layer stack that is most proximate to the dielectric; and
at least one electrically conductive interlayer arranged between the upper and lower layers,
wherein the upper layer and the lower layer of the layer stack are each electrically conductive conduction layers of substantially the same material; and
an electrically conductive oxide layer arranged between the layer stack and the dielectric, wherein the oxide layer comprises a layer thickness of approximately 1 nm.

34. The circuit arrangement as claimed in claim 33, wherein the oxide layer adjoins the dielectric and the lower layer adjoins the oxide layer.

35. The integrated circuit arrangement as claimed in claim 33, wherein the electrically conductive structure, layer stack, and oxide layer form part of a dual Damascene integrated circuit arrangement.

36. The integrated circuit arrangement as claimed in claim 35, wherein oxide layer comprises ruthenium oxide.

* * * * *